(12) United States Patent
Raukopf et al.

(10) Patent No.: US 10,451,646 B2
(45) Date of Patent: Oct. 22, 2019

(54) SENSOR WITH SYMMETRICALLY EMBEDDED SENSOR ELEMENTS

(71) Applicant: Continental Teves AG & Co. oHG, Frankfurt (DE)

(72) Inventors: Svenja Raukopf, Gemünden Felda-Hainbach (DE); Jakob Schillinger, Gaimersheim (DE); Michael Schulmeister, Groß-Zimmern (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 188 days.

(21) Appl. No.: 15/540,791

(22) PCT Filed: Jan. 26, 2016

(86) PCT No.: PCT/EP2016/051575
§ 371 (c)(1),
(2) Date: Jun. 29, 2017

(87) PCT Pub. No.: WO2016/120272
PCT Pub. Date: Aug. 4, 2016

(65) Prior Publication Data
US 2018/0011124 A1    Jan. 11, 2018

(30) Foreign Application Priority Data

Jan. 28, 2015 (DE) .................. 10 2015 201 482

(51) Int. Cl.
*G01P 3/44* (2006.01)
*G01D 11/24* (2006.01)
(Continued)

(52) U.S. Cl.
CPC .............. *G01P 3/44* (2013.01); *B81B 7/0054* (2013.01); *G01D 5/165* (2013.01); *G01D 11/245* (2013.01);
(Continued)

(58) Field of Classification Search
CPC ....... G01P 3/44; B81B 7/0054; B81B 7/0045; B81B 7/0019
(Continued)

(56) References Cited

U.S. PATENT DOCUMENTS 4,937,656 A    6/1990  Kohara
6,003,369 A   12/1999  Tola et al.
(Continued)

FOREIGN PATENT DOCUMENTS

CN         1578911 A       2/2005
CN       100507573 C       7/2009
(Continued)

OTHER PUBLICATIONS

Non Final Office Action for U.S. Appl. No. 15/542,825, dated Sep. 14, 2018, 20 pages.
(Continued)

*Primary Examiner* — Peter J Macchiarolo
*Assistant Examiner* — Irving A Campbell
(74) *Attorney, Agent, or Firm* — RatnerPrestia

(57) ABSTRACT

A sensor for detecting a physical variable, including: —a sensor element for outputting an electrical signal dependent on the physical variable, —a substrate carrying the sensor element, —a printed circuit board, conducting the electrical signal, on the substrate, and —an embedding compound, in which the sensor element is completely embedded and the printed circuit board is at least partly embedded, —wherein at least one compensation element is embodied in the embedding compound, by which compensation element a
(Continued)

Figure 1:
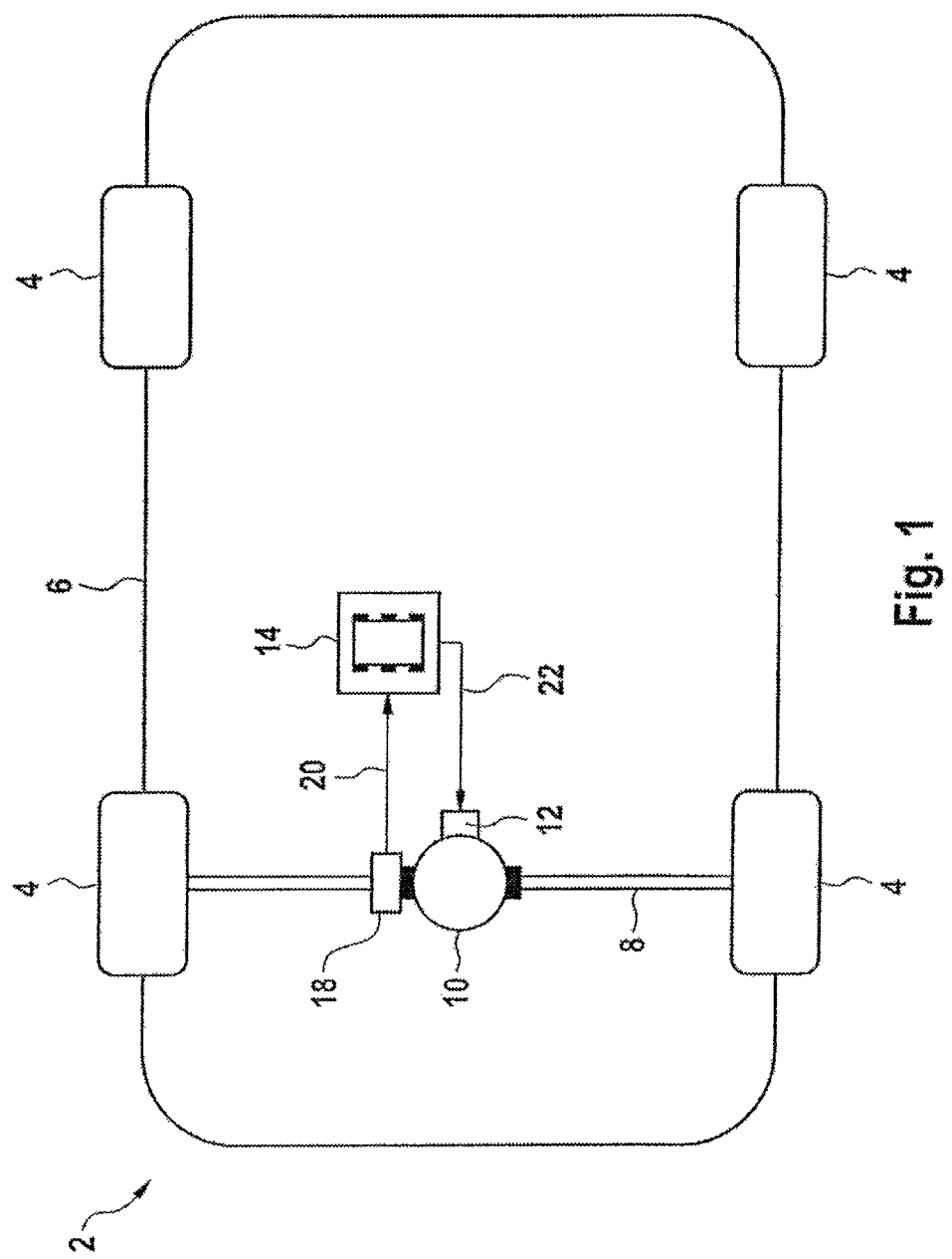

mechanical stress caused by an element of the sensor at least partly embedded in the embedding compound is counteracted.

11 Claims, 9 Drawing Sheets

(51) Int. Cl.
  *G01D 5/165* (2006.01)
  *B81B 7/00* (2006.01)
(52) U.S. Cl.
  CPC ............... B81B 2207/012 (2013.01); *H01L 2224/48137* (2013.01); *H01L 2224/48247* (2013.01)
(58) Field of Classification Search
  USPC .................................................. 73/514.39
  See application file for complete search history.

(56) References Cited

U.S. PATENT DOCUMENTS

| | | | |
|---|---|---|---|
| 7,427,808 B2 | 9/2008 | Brandl et al. | |
| 7,965,075 B2 | 6/2011 | Mueller et al. | |
| 8,426,930 B2 | 4/2013 | Holzmann et al. | |
| 8,492,931 B2 | 7/2013 | Kim et al. | |
| 8,671,752 B2 | 3/2014 | Hoefer et al. | |
| 8,796,792 B2 | 8/2014 | Zuniga-Ortiz et al. | |
| 8,820,160 B2 | 9/2014 | Doering et al. | |
| 8,833,160 B2 | 9/2014 | Hoenicka et al. | |
| 9,061,454 B2 | 6/2015 | De Volder et al. | |
| 9,243,577 B2 | 1/2016 | Knittel et al. | |
| 9,316,718 B2 | 4/2016 | Stahlin et al. | |
| 9,649,796 B2 | 5/2017 | Panis et al. | |
| 9,661,775 B2 | 5/2017 | Schillinger et al. | |
| 2003/0110847 A1 | 6/2003 | Kubo et al. | |
| 2004/0002236 A1 | 1/2004 | Norman et al. | |
| 2004/0207077 A1 | 10/2004 | Leal et al. | |
| 2005/0018410 A1 | 1/2005 | Brandenburg et al. | |
| 2005/0067695 A1 | 3/2005 | Brandl et al. | |
| 2006/0270512 A1* | 11/2006 | Pinkos ................... | F16H 48/08 475/231 |
| 2010/0117171 A1 | 5/2010 | Hesen et al. | |
| 2010/0271787 A1 | 10/2010 | Holzmann et al. | |
| 2011/0203369 A1* | 8/2011 | Hoefer ................... | B81B 7/0048 73/431 |
| 2013/0249546 A1 | 9/2013 | David et al. | |
| 2014/0015123 A1 | 1/2014 | Bowles et al. | |
| 2015/0362339 A1 | 12/2015 | Acker | |
| 2016/0013112 A1* | 1/2016 | Ihle ....................... | G01D 11/245 257/414 |

FOREIGN PATENT DOCUMENTS

| | | |
|---|---|---|
| CN | 101852811 A | 10/2010 |
| CN | 102640285 A | 8/2012 |
| CN | 102782456 A | 11/2012 |
| CN | 104011510 A | 8/2014 |
| DE | 102006030081 A1 | 2/2007 |
| DE | 102005043413 A1 | 3/2007 |
| DE | 102008064047 A1 | 4/2010 |
| DE | 102009001969 A1 | 10/2010 |
| DE | 102010042438 A1 | 7/2011 |
| DE | 102011121412 A1 | 6/2013 |
| DE | 102012206552 A1 | 10/2013 |
| DE | 102013214915 A1 | 1/2014 |
| DE | 102013101732 A1 | 8/2014 |
| DE | 102014201790 A1 | 8/2014 |
| WO | 2004008577 A2 | 1/2004 |
| WO | 2007060289 A1 | 5/2007 |
| WO | 2008008140 A2 | 1/2008 |
| WO | 2010037810 A1 | 4/2010 |
| WO | 2010139526 A1 | 12/2010 |

OTHER PUBLICATIONS

German Search Report for German Application No. 10 2016 201 097.2, dated Dec. 9, 2016, including partial English translation, 12 pages.

International Search Report and Written Opinion for International Application No. PCT/EP2016/051575, dated Apr. 8, 2016, 7 pages.

German Search Report for German Application No. 10 2016 201 096.4, dated Dec. 9, 2016, including partial English translation, 12 pages.

International Search Report and Written Opinion for International Application No. PCT/EP2016/051571, dated Mar. 18, 2016, 7 pages.

Chinese Office Action for Chinese Application No. 201680005043.6, dated Dec. 25, 2018, with translation, 13 pages.

Notice of Allowance for U.S. Appl. No. 15/542,825, dated Jan. 4, 2019—5 pages.

* cited by examiner

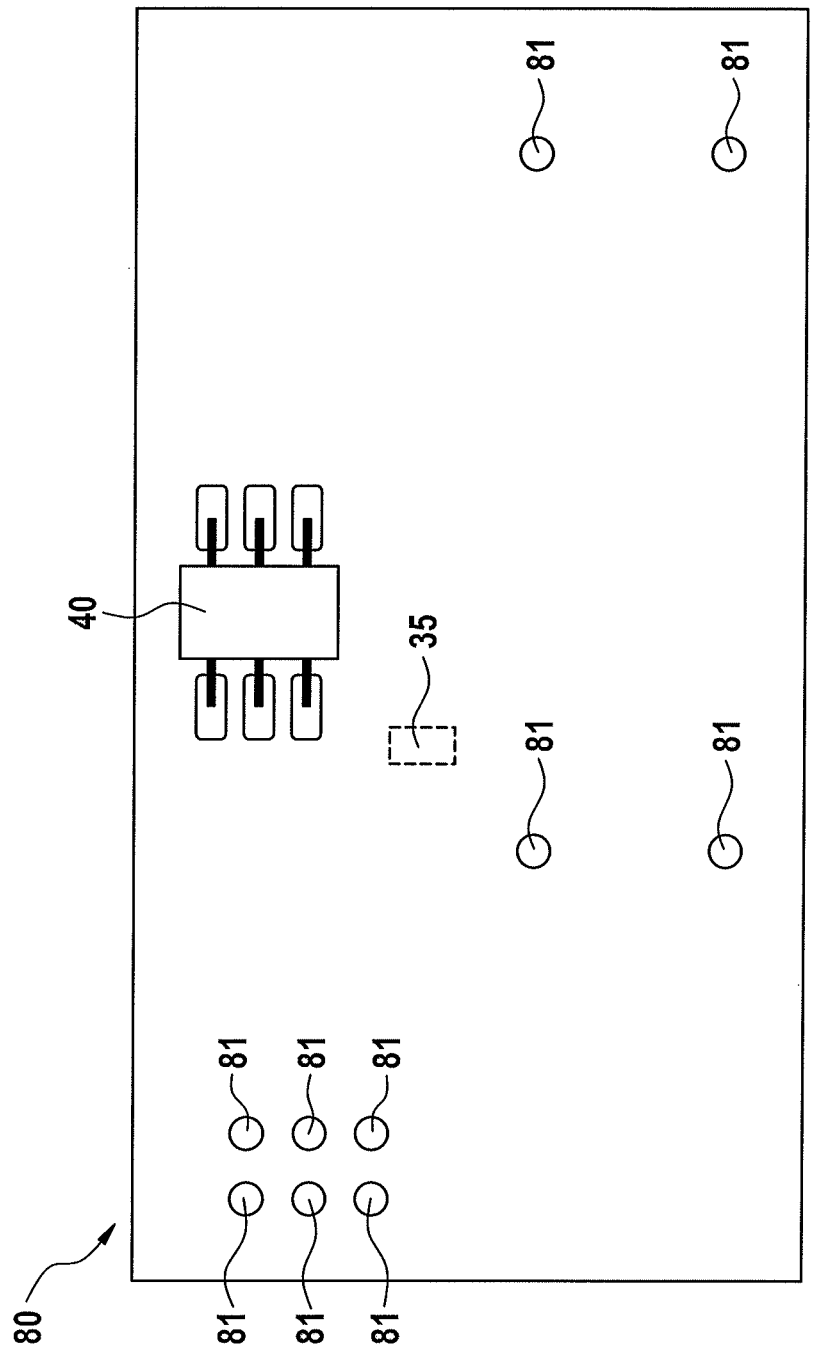

SENSOR WITH SYMMETRICALLY EMBEDDED SENSOR ELEMENTS

CROSS REFERENCE TO RELATED APPLICATIONS

This application is the U.S. National Phase application of PCT/EP2016/051575, filed Jan. 26, 2016, which claims priority to German Patent Application No. 10 2015 201 482.7, filed Jan. 28, 2015, the contents of such applications being incorporated by reference herein.

FIELD OF THE INVENTION

The invention relates to a sensor for detecting a physical variable and to a control device for a vehicle having the sensor.

BACKGROUND OF THE INVENTION

In WO 2010/037 810 A1, which is incorporated by reference a sensor for detecting a physical signal is disclosed. The sensor comprises a lead frame, which as a circuit substrate supports the sensor components of the sensor and also interconnects them. The sensor components are enclosed in a circuit housing with the lead frame.

SUMMARY OF THE INVENTION

An aspect of the invention aims to improve the known sensor.

In accordance with one aspect of the invention, a sensor for detecting a physical variable comprises a sensor element for outputting an electrical signal dependent on the physical variable, a substrate supporting the sensor element, a conductor track conducting the electrical signal on the substrate and an embedding compound, in which the sensor element is completely embedded and the conductor track is at least partially embedded.

In accordance with an aspect of the invention, at least one compensation element is embodied in the embedding compound of the specified sensor, by means of which compensation element a mechanical stress induced by an element of the specified sensor at least partially embedded in the embedding compound is counteracted.

The specified sensor is based on the consideration that the above-mentioned sensor in a vehicle is normally used in a circuit assembly. These consist of a plurality of components combined together to form a higher-level circuit. The higher-level circuit in such cases is typically very large however, which is not compatible with the ever increasing requirements for miniaturization in the automotive industry.

One solution would be not to manufacture the sensor using a lead frame as cited above, but to mount the sensor element directly on a circuit substrate which implements the higher-level circuit. However, this presents the problem that in order to ensure a long service life the sensor element must be embedded in a protective material. Due to temperature changes and other influences however, this protective material introduces mechanical stress or mechanical tension into the overall system, which can damage the overall system and reduce its service life.

The specified sensor addresses this problem by proposing to design the sensor in such a way that the mechanical stress induced by an element in the sensor is compensated for. To achieve this, at least two elements of the sensor are arranged such that the resulting mechanical stress cancels out overall.

The compensation element provided for this purpose, with which the freedom from mechanical tension is to be achieved as best as possible, can be an element necessary for the function of the sensor, or a redundant element that is specifically introduced into the specified sensor for the purpose of neutralizing the mechanical stress.

Outwardly, the sensor is thus mechanically free of stress, enabling the service life of the specified sensor to be significantly increased.

In an extension of the specified sensor, the compensation element and the element of the sensor which causes the mechanical stress are arranged symmetrically, in particular point symmetrically. The symmetrical arrangement of the two elements attempts to achieve an ideal condition, in which the mechanical stress is as far as possible completely cancelled out.

The compensation element may be made of a different material from the embedding compound, by being embodied, for example, as a lacquer, as a redundant through hole or as a cavity in the embedding compound.

In an additional extension of the specified sensor, the element of the sensor at least partially embedded in the embedding compound comprises the sensor element. In contrast, the compensation element can comprise an electrical component which differs from the sensor element, and can therefore be designed to be non-redundant.

Such a non-redundant component can be, for example, a filter element for increasing the electromagnetic compatibility, known as EMC.

In a particular extension of the specified sensor, an electrical contact between the conductor track and the sensor element may be different from an electrical contact of the compensation element with the conductor track or with another conductor track. In this way, different geometric or other different causal factors between the two elements can be compensated. For this purpose the electrical contacts can differ, for example, in their size, wherein the size difference should be designed in such a way that the mechanical stress is further reduced.

In accordance with a further aspect of the invention, a control device for a vehicle for controlling a behavior of the vehicle based on a detected physical variable comprises one of the specified sensors for detecting the physical variable.

BRIEF DESCRIPTIONS OF THE FIGURES

Figure 2:
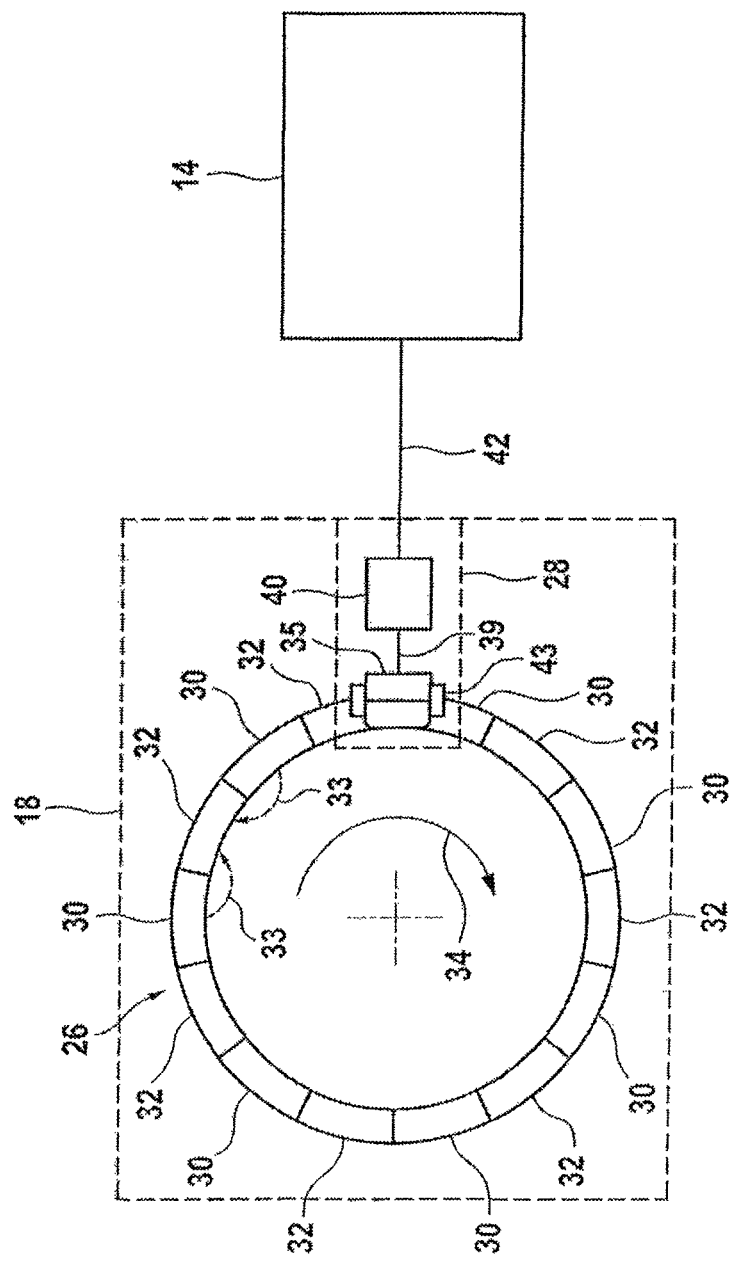
Figure 3:
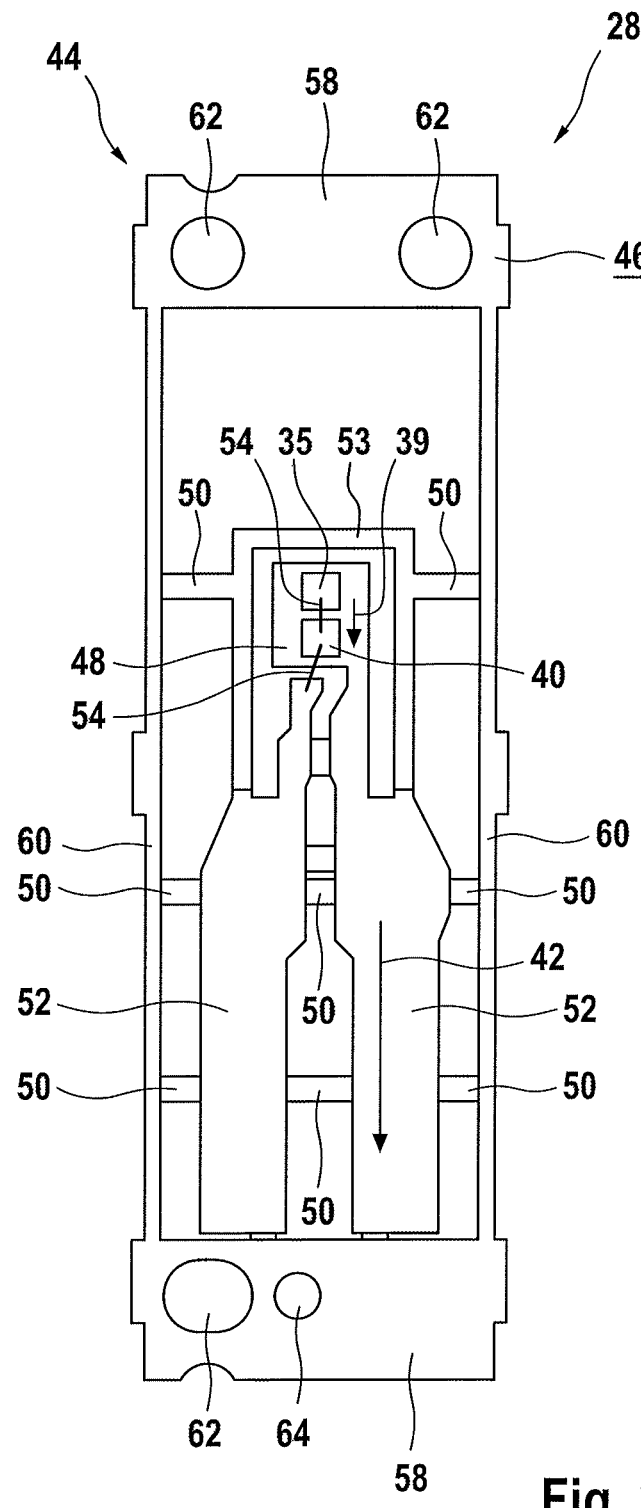
Figure 4:
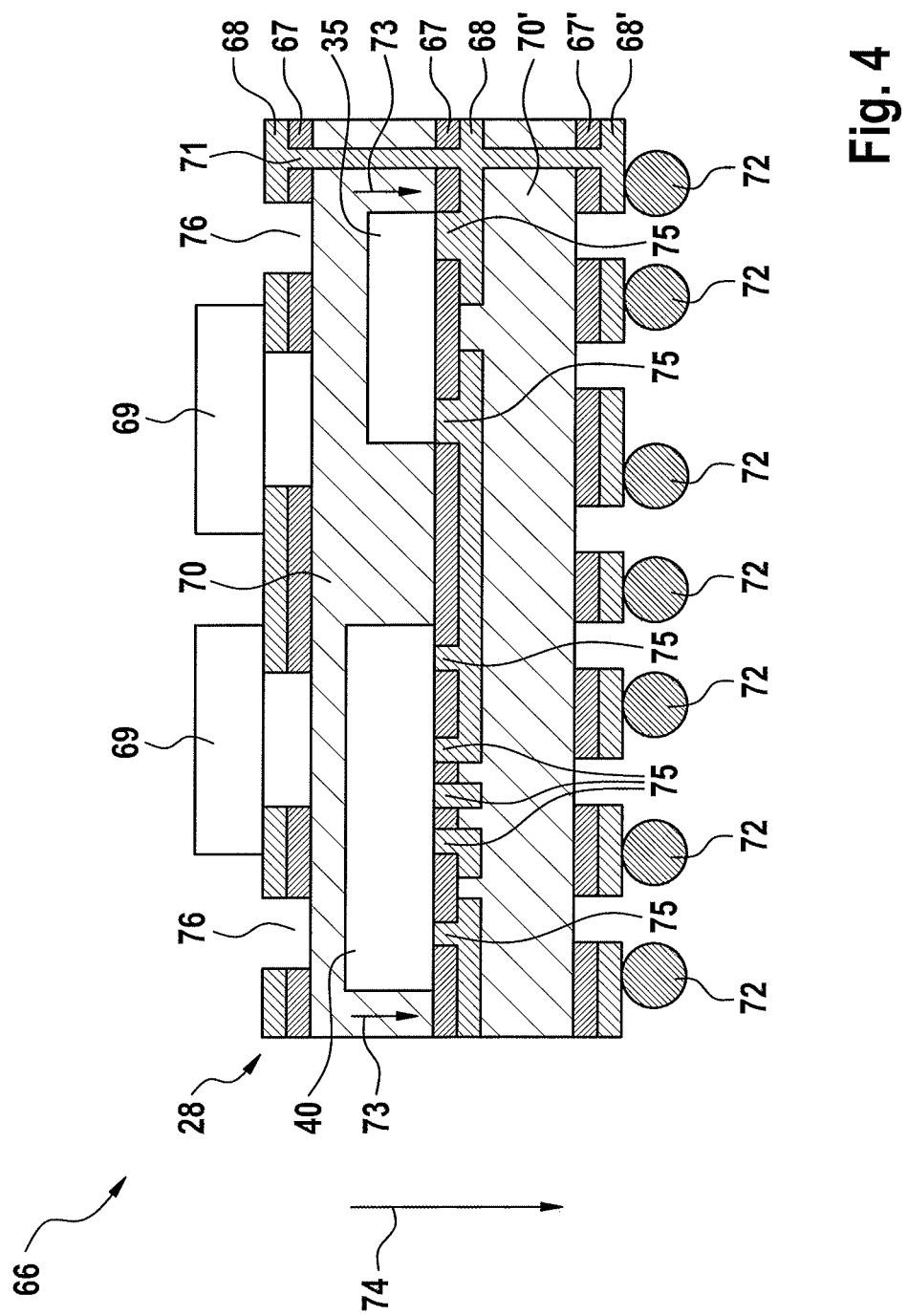
Figure 5:
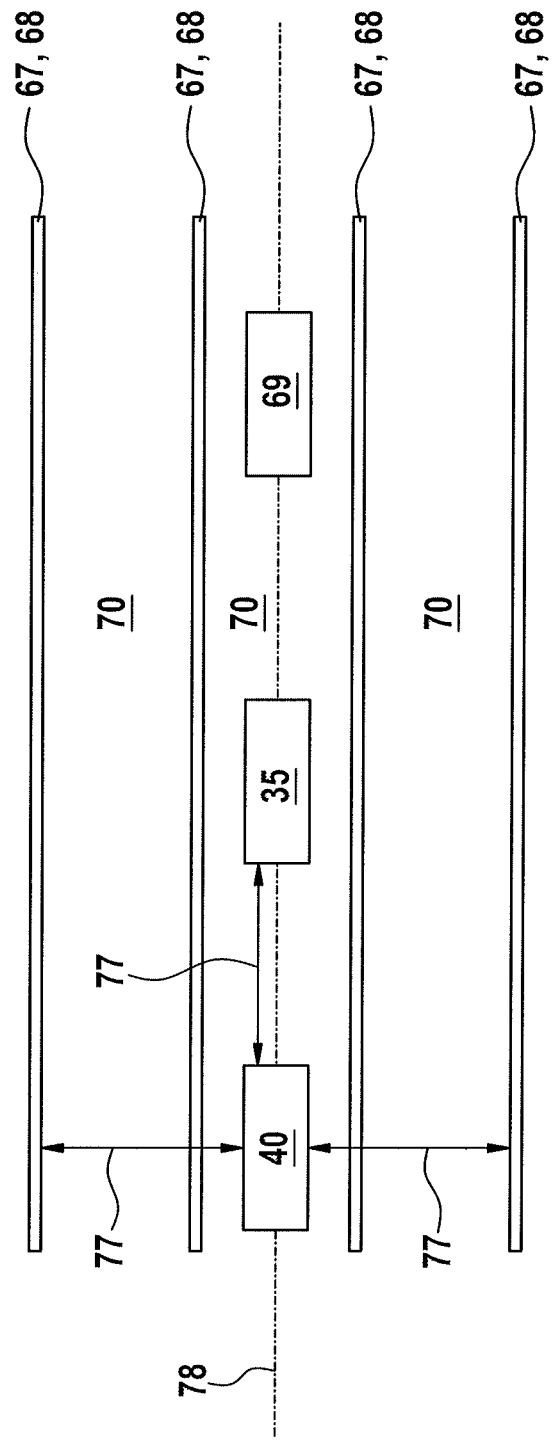
Figure 6:
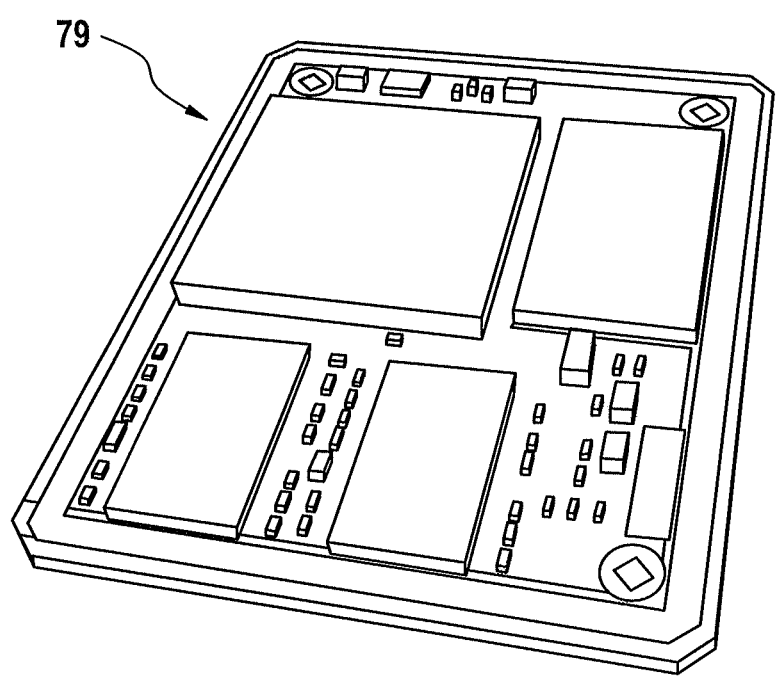
Figure 7:
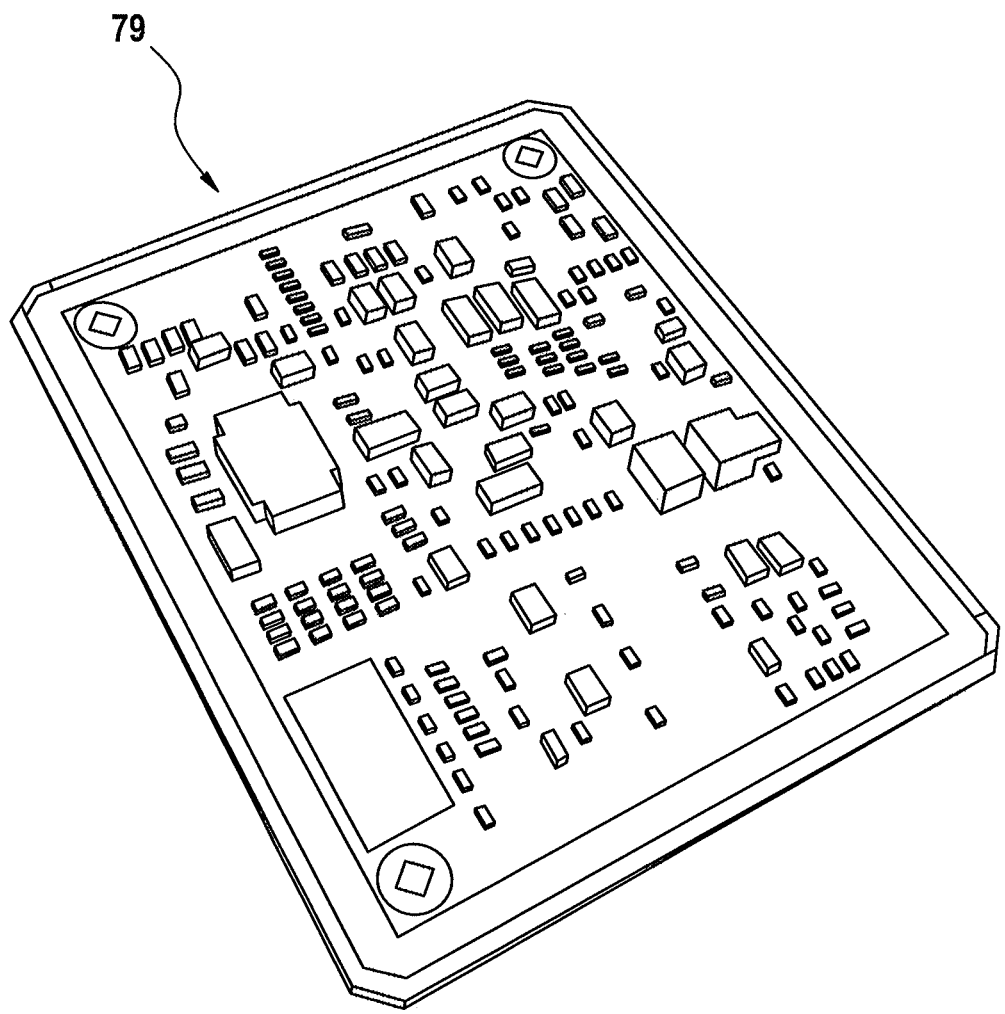
Figure 8:
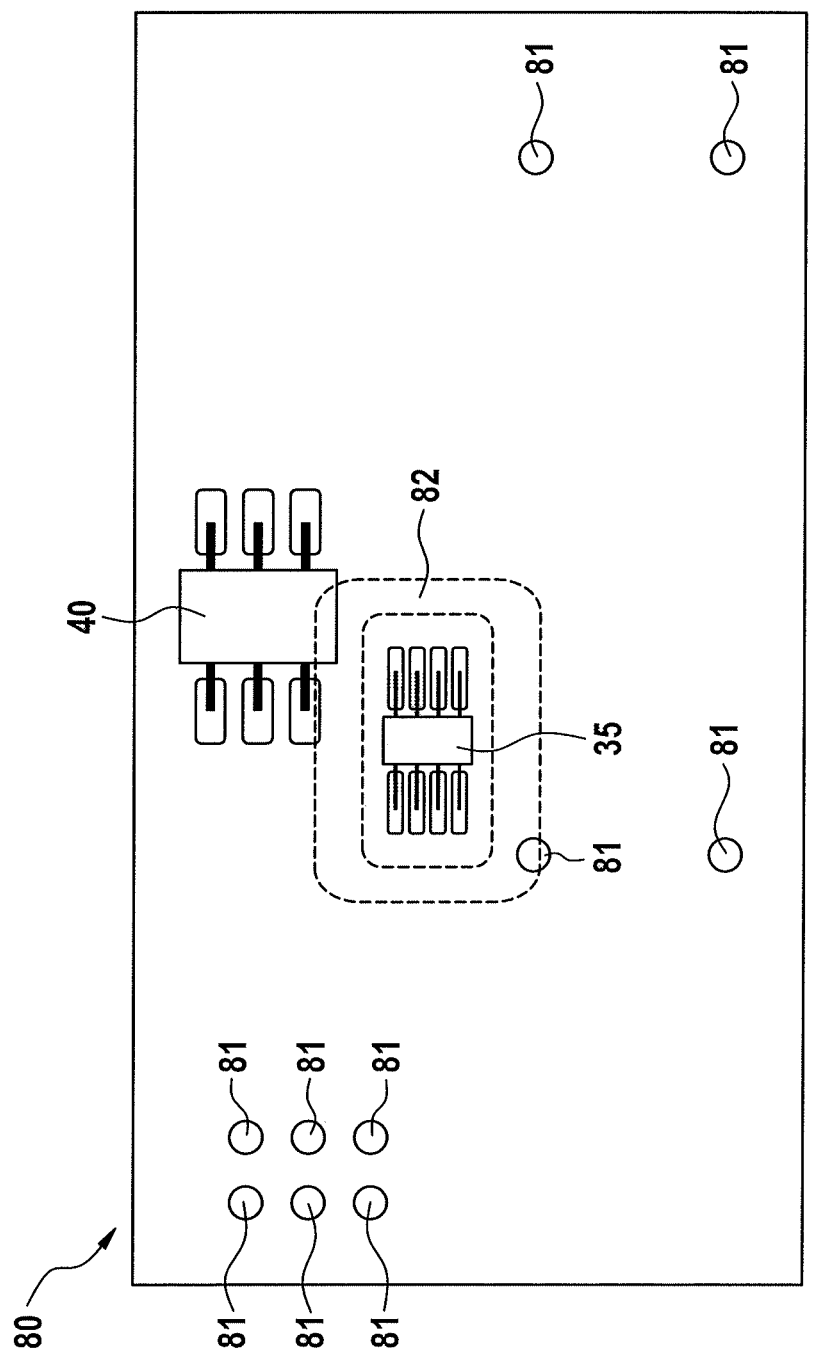

The properties, features and advantages of the present invention described above and the manner in which these are achieved will become clearer and more comprehensible in conjunction with the following description of the exemplary embodiments, which are explained in more detail in connection with the drawings, which show:

FIG. 1 a schematic view of a vehicle with a driving dynamics regulation unit,

FIG. 2 a schematic representation of a rotation speed sensor in the vehicle of FIG. 1, FIG. 3 a schematic representation of a read head of the rotation speed sensor of FIG. 2 in an intermediate production state, FIG. 4 a schematic sectional view of an alternative read head, FIG. 5 a schematic view of an ideal, theoretical arrangement of different components for a read head, FIG. 6 a control device from a first perspective, FIG. 7 the control device of FIG. 6 from a second perspective, FIG. 8 a schematic plan view of a linear position sensor, and FIG. 9 a schematic plan view of an alternative linear position sensor.

DETAILED DESCRIPTION OF THE PREFERRED EMBODIMENTS

In the figures identical technical elements are provided with the same reference numerals and described only once.

Reference is made to FIG. 1, which shows a schematic diagram of a vehicle 2 with a chassis 6 supported on wheels 4. Two of the wheels 4 are driven via an axle 8 by an internal combustion engine 10. The basic operating principle of an internal combustion engine is known and will therefore not be further discussed below.

In a known manner, see for example DE 10 2012 206 552 A1, which is incorporated by reference, the valve timing of the internal combustion engine 10 can be adjusted with a camshaft timer 12, in order to adjust the load point of the internal combustion engine 10 to obtain a better fuel utilization in different rotation speed ranges. To achieve this a camshaft control device 14 detects the rotation speed 20 of the internal combustion engine 10 using a rotation speed sensor 18, and with a control signal 22 controls the camshaft timer 12 based on the detected rotation speed 20. The means of generating the control signal 18 based on the rotation speed 20 is known and will not be discussed further below. Details of this can be found in the relevant specialist literature.

The rotation speed sensor 18 in the context of the present embodiment is designed in a particular way. Before this is discussed in more detail, the basic structure of the rotation speed sensor 18 itself will be described in greater detail. To do so, reference is made to FIG. 2, which shows a schematic view of a possible embodiment of the rotation speed sensor 18 in the vehicle 2 of FIG. 1.

The rotation speed sensor 18 in the present embodiment is designed as an active rotation speed sensor, which comprises an encoder disk 26 mounted in a rotationally fixed manner on the rotor, not shown, of the internal combustion engine 10, and a read head 28 which is mounted on the chassis 6 in a fixed position.

The encoder disk 26 in the present embodiment consists of magnetic north poles 30 and magnetic south poles 32 chained together, which jointly excite a magnetic encoder field 33 indicated with an exemplary arrow. When the encoder disk 26 mounted on the rotor of the internal combustion engine 10 rotates with the latter in a direction of rotation 34, the magnetic encoder field 33 rotates with it.

The read head 28 in the present embodiment comprises a sensor probe 35, which generates an electrical sensor signal 39 as a function of the motion of the magnetic encoder field 33. Any desired measuring principle can be used for this purpose, such as a measuring principle based on the magneto-resistive effect. The electrical sensor signal 39 therefore depends on the rotation speed 20 to be detected.

The sensor signal 39 can then be processed in a signal processing circuit 40 arranged in the read head 28. Here, a pulse signal 42 is usually created from the sensor signal 39, wherein over a predefined time segment the pulse signal 42 comprises a number of pulses which is dependent on the rotation speed to be detected. This pulse signal 42 is then output to the camshaft control device 14, which can then derive the rotation speed 20 by counting the number of pulses in the pulse signal 42.

Because, as is well known, non-negligible interfering fields occur due to the internal combustion engine 10, a support magnet 43 is arranged in the read head 28, which counteracts these interfering fields and thus enables detection of the rotation speed 20 with low tolerances. The support magnet 43 should therefore be selected to be sufficiently strong to be able to adequately counteract the interfering fields.

Conventionally, the read head 28 is embodied on a lead frame, as is known, for example, from the above-mentioned prior art in WO 2010/037 810 A1, which is incorporated by reference. Such a lead frame is shown for example in FIG. 3 and referenced with the reference number 44. The lead frame 44 comprises a supporting frame 46, an insertion island 48 on which the read head 28 is supported and interconnected, two dambars 50 and two contact terminals 52. The dambars 50 hold the contact terminals 52 directly and hold the insertion island 48 via an auxiliary frame 53 on the supporting frame 46. In the lead frame 44 the supporting frame 46, the insertion island 48, the dambars 50, the contact terminals 52 and the auxiliary frame 53 are designed as an integral stamped part or stamped frame, in which the above-mentioned elements are formed by stamping from an electrically conductive metal plate.

In the context of the present embodiment the sensor probe 35, for example in the form of a magneto-resistive element, and the signal evaluation circuit 40 are mounted on the insertion island 48 and electrically contacted, for example by soldering or bonding. The sensor probe 35 and the signal evaluation circuit 40 are also connected to each other via a bonding wire 54, so that the sampled signal 39 can be transmitted between the sensor probe 35 and the signal evaluation circuit 40 via the insertion island 48 and the bonding wire 54.

The insertion island 48 in the present embodiment is connected directly to one of the two contact terminals 52, while the other of the two contact terminals 52 is electrically isolated from the insertion island 48 and is connected to the signal evaluation circuit 40 via a further bonding wire 54. In this way, the data signal 42 can be output from the signal evaluation circuit 40 via the two contact terminals 52.

The supporting frame 46 in the context of the present embodiment comprises two parallel running transport strips 58, which are connected to each other via connecting webs 60. The transport strip 58 comprises transport holes 62, into which a transport tool (not illustrated further) can engage and move the lead frame 44. On the transport strip 58 an index hole 64 is also formed, by means of which the position of the lead frame 44 during transport can be defined and therefore regulated.

To protect the read head 28 a housing can be formed around the insertion island 48, which supports the read head 28, and a part of the contact terminals 52. The housing can be designed, for example, as a protective compound around the read head 28, on which point for the sake of brevity reference is made to the relevant prior art, such as DE 10 2008 064 047 A1, which is incorporated by reference.

This read head 28 must now be at least electrically connected to the camshaft control device 14, so that the pulse signal 42 can be transmitted to this. The necessary electrical connection processes required increase not only the manufacturing costs, but the resulting connection in principle represents a source of error, both electrically as well as mechanically, on the basis of which the read head 28 and therefore the entire rotation speed sensor 18 may fail.

The exemplary embodiment addresses this problem by proposing to embed the read head 28 of the rotation speed sensor 18 in a printed circuit board module. Such a printed circuit board module will be explained in more detail hereafter on the basis of FIG. 4, in which it is shown in a sectional view with the reference numeral 66.

The printed circuit board module 66 comprises a plurality of insulating layers 67 stacked on top of one another, on which conductor tracks 68 are applied. The conductor tracks 68 or the insulating layers 67 carry the individual components 35, 40 constituting the read head 28 of the rotation speed sensor 18, which, in addition to the already mentioned sensor probe 35 and the already mentioned signal processing circuit 40, can also include filter elements 69 as passive components, which increase the electromagnetic compatibility of the read head 28 and therefore the rotation speed sensor 18.

The sensor probe 35 and the signal processing circuit 40 in the present embodiment are embedded in an embedding compound 70 between two insulating layers 67 of the printed circuit board module 66. In this way, these elements are protected against external influences. The individual layers can be electrically connected to each other via plated-through holes 71. Solder joints 72 can also be present on the printed circuit board module 66, to electrically connect the printed circuit board module 66 to a higher-level circuit.

The problem with the embedding as shown in FIG. 4, however, is the fact that individual mechanical stress 73, which is caused by the individual mechanical components 35, 40, 69, for example due to temperature variations, sums together into a total mechanical stress 74, which in turn, for example, can deform the printed circuit board module 66. This deformation can among other things cause the solder joints 72 to become detached from the higher-level circuit, and lead to failure of the read head 28 and thus the rotation speed sensor 18.

The exemplary embodiment addresses this problem by proposing to design the printed circuit board module 66 as symmetrically as possible, so that the individual mechanical stress 73 caused by the individual components 35, 40, 69 is mutually canceled out and the total mechanical stress 74 is thus minimized. To this end different compensation elements are present in the printed circuit board module 66, which can counteract an individual mechanical stress 73. It is not strictly necessary to actually implement all the compensation elements shown in the printed circuit board module 66 in order to realize the idea behind the embodiment. The individual compensation elements shown are only intended as an example to demonstrate how the components can be arranged symmetrically in the printed circuit board module 66, to keep the total mechanical stress below a specific, reasonable limit.

On the one hand it is possible to introduce a redundant conductor track 68' and a redundant insulating layer 67' as a compensation element, in order to design a symmetrical conductor track arrangement in the printed circuit board module 66. Therefore, a redundant embedding compound 70' is also incorporated, which can be selected to be either different from the embedding compound 70 or, alternatively, identical to it.

As a further option, the sensor probe 35 and the signal processing circuit 40 can be designed symmetrical to each other. The advantage in this case is that no redundant components need to be incorporated into the printed circuit board module 66 as compensation elements. In order to compensate for differences in the geometrical, material or other inherent physical properties between the two components 35, 40, it is also possible to dimension the contacts 75 between the conductor tracks and the individual components 35, 40, 69 in different geometries, which is indicated in FIG. 4 by variations in the width of the contacts 75 on the sensor probe 35 and on the signal processing circuit 40.

In addition, redundant cutouts 76 can be introduced into the printed circuit board module 66 as compensation elements.

The ideal case of the printed circuit board module 66 is shown in FIG. 5. Here all of the distances 77 between the individual elements are symmetrical to one another with respect to an axis of symmetry 78. In practice however, this ideal concept cannot be implemented, for the simple reason that the components 35, 40, 69 could then no longer be contacted with the conductor tracks 68. But the ideal case should be attempted in the design of the printed circuit board module 66 as far as possible.

The sensor probe 35 should be arranged as centrally as possible, so that the individual mechanical stress 73 on the probe remains as small as possible. In this way, measurement errors induced by the individual mechanical stress 73 can be kept small.

By embedding the components 40, 35 and passive components 69, it is possible to miniaturize the resulting sensor system 28 to a significant extent. At the same time, additional components of a control device, such as the camshaft control device 14, can be embedded as well. This enables printed circuit board space or component mounting surface to be reduced on the control device, i.e. in the exemplary embodiment of the camshaft control device 14.

Furthermore, it is not necessary to encase the individual components 35, 40 once again in an extra encapsulation step, for example by injection pressing, with protective compound referred to above in the context of FIG. 3. By enclosing the components with the embedding compound 70 over their whole surface, for example in the form of a resin, such a protective compound becomes obsolete. At the same time, a resin offers better thermal properties for dissipating heat generated by power loss of the components as, e.g., airborne convection. By means of the printed circuit board design it is very simple to implement simple EMC protection measures in the printed circuit board layer structure. The connection of the sensor system in the form of the read head 28 to the printed circuit board of the control device, in other words the camshaft control device 14, can be designed in a mechanically more robust way by surface contacting. The electrical contacting of the components 35, 40 of the read head 28 to each other and to the substrate by wire bonding technology is no longer required. The contact can be achieved via a structuring of the conductor tracks 68, which can be embodied for example as copper foils (inner layers of a printed circuit board). This creates a more robust and much shorter signal connection.

The exemplary embodiment has been described by reference to a rotation speed sensor 18. In alternative or additional sensors, in which the previously explained idea can be used, the sensor probe 35 can detect, for example, accelerations, rotation rates and/or mechanical vibration.

Alternatively, the previously explained idea, as has been previously mentioned, can be applied in entire control devices. For example, a Car2X control device 79 shown in a perspective view in FIGS. 6 and 7 should be mentioned for this purpose. These are control devices that can subscribe to mobile ad-hoc networks (known as Car2x), which are known for example from WO 2010/139 526 A1, which is incorporated by reference. The nodes of such Car2X networks can be particular road traffic users, such as vehicles or other objects found in a road traffic situation, such as traffic lights. Via these networks, information on road traffic conditions, such as accidents, congestion, dangerous situations, . . . can be provided to the road traffic users subscribed to the Car2X network.

By the use of the previously described idea in entire control devices, such as the previously mentioned Car2X control device, any twisting or warping of the modules implemented in the control device can be reduced.

A further advantage of the above-specified idea will be explained hereafter by reference to FIGS. 8 and 9. These figures show a linear position sensor 80, or LIPS, as is known for example from DE 10 2014 201 790 A1, which is incorporated by reference.

The LIPS 80 comprises a printed circuit board consisting of conductor tracks 68 and insulation layer 67, on which a plurality of insertion points 81 for press-fit connections are formed, to connect the sensor to a higher-level electrical system.

As the measuring transducer 35 a coil structure can be used, as is disclosed in the previously mentioned patent document. In addition, a signal processing circuit 40 can again be arranged to adapt sensor signals from the measuring transducer 35 before they are output to the higher-level electrical system.

The measuring transducer 35 in a LIPS 80 is a so-called fine pitch component, for the protection of which a lacquered region 82 suggested in FIG. 8 must be formed in a known manner. By embedding the measuring transducer 35, in the context of the idea described above as shown in FIG. 9, this lacquered region 82 can be completely omitted, which enables the miniaturization to be further increased.

The invention claimed is:

1. A sensor for detecting a physical variable, comprising:
a sensor element for outputting an electrical signal dependent on the physical variable,
a substrate supporting the sensor element,
a conductor track conducting the electrical signal on the substrate, and
an embedding compound, in which the sensor element is completely embedded and the conductor track is at least partially embedded,
wherein at least one compensation element is at least partially embedded in the embedding compound, by which compensation element a mechanical stress induced by an element of the sensor at least partially embedded in the embedding compound is counteracted, the at least one compensation element comprising an electrical component which differs from the sensor element.

2. The sensor as claimed in claim 1,
wherein the compensation element and the element of the sensor which causes the mechanical stress are arranged symmetrically.

3. The sensor as claimed in claim 2,
wherein the compensation element is made of a different material from the embedding compound.

4. The sensor as claimed in claim 1,
wherein the compensation element is made of a different material from the embedding compound.

5. The sensor as claimed in claim 1,
wherein the element of the sensor at least partially embedded in the embedding compound comprises the sensor element.

6. The sensor as claimed in claim 1,
wherein the electrical component that differs from the sensor element is a filter element or a signal processing circuit.

7. A control device for a vehicle for controlling a behavior of the vehicle based on a detected physical variable, comprising a sensor as claimed in claim 1, for detecting the physical variable.

8. The sensor as claimed in claim 1,
wherein an electrical contact between the conductor track and the sensor element is different from an electrical contact of the compensation element with the conductor track or with another conductor track.

9. A sensor for detecting a physical variable, comprising:
a sensor element for outputting an electrical signal dependent on the physical variable,
a substrate supporting the sensor element,
a conductor track conducting the electrical signal on the substrate, and
an embedding compound, in which the sensor element is completely embedded and the conductor track is at least partially embedded,
wherein at least one compensation element is provided, by which compensation element a mechanical stress induced by an element of the sensor at least partially embedded in the embedding compound is counteracted, and
wherein an electrical contact between the conductor track and the sensor element is different from an electrical contact of the compensation element with the conductor track or with another conductor track.

10. The sensor as claimed in claim 9,
wherein the electrical contacts differ in their size.

11. The sensor as claimed in claim 10,
wherein the size difference is designed in such a way that the mechanical stress is further reduced.

* * * * *